United States Patent
Kudekar et al.

(10) Patent No.: US 10,686,556 B2
(45) Date of Patent: Jun. 16, 2020

(54) ROBUST AND UNIVERSAL POLAR CODES

(71) Applicant: QUALCOMM Incorporated, San Diego, CA (US)

(72) Inventors: Shrinivas Kudekar, Raritan, NJ (US); Gabi Sarkis, San Diego, CA (US); Thomas Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 15/870,197

(22) Filed: Jan. 12, 2018

(65) Prior Publication Data

US 2018/0205496 A1    Jul. 19, 2018

Related U.S. Application Data

(60) Provisional application No. 62/447,343, filed on Jan. 17, 2017.

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01); *H04L 1/0041* (2013.01)

(58) Field of Classification Search
CPC ... H04L 1/0009; H04L 1/0057; H04L 1/0061; H03M 13/1102; H03M 13/13; H03M 13/1151; H03M 13/1154; H03M 13/116; H03M 13/1174
See application file for complete search history.

(56) References Cited

U.S. PATENT DOCUMENTS

| | | | |
|---|---|---|---|
| 2013/0117344 A1* | 5/2013 | Gross ...................... | G06F 17/10 708/490 |
| 2014/0169492 A1* | 6/2014 | Mahdavifar .......... | H03M 13/13 375/267 |

(Continued)

OTHER PUBLICATIONS

Arikan, "Channel Polarization: a Method for Constructing Capacity-Achieving Codes for Symmetric Binary-Input Memoryless Channels," IEEE Transactions on Information Theory, vol. 55, Issue 7, Jul. 2009, pp. 3051-3073, XP_11262510A, Institute of Electrical and Electronics Engineers. (Year: 2013).*

(Continued)

*Primary Examiner* — Romani Ohri
(74) *Attorney, Agent, or Firm* — Loza & Loza, LLP

(57) ABSTRACT

Aspects of the disclosure relate to polar coding. A polar codeword may be generated by sorting a plurality of synthetic channels utilized for transmission of the polar codeword over an air interface in order of reliability utilizing a convex combination of the mutual information calculated for each synthetic channel based on an Additive White Gaussian Noise (AWGN) channel and the mutual information calculated for each synthetic channel based on a binary erasure channel. A polar codeword may further be generated by sorting the plurality of synthetic channels in order of reliability utilizing cumulative sums calculated for each synthetic channel. Each cumulative sum may be calculated from a binary representation of a position of the synthetic channel within the plurality of synthetic channels.

27 Claims, 8 Drawing Sheets

(56) References Cited

U.S. PATENT DOCUMENTS

| | | | |
|---|---|---|---|
| 2014/0208183 A1* | 7/2014 | Mahdavifar | H03M 13/296 |
| | | | 714/755 |
| 2015/0026543 A1* | 1/2015 | Li | H03M 13/13 |
| | | | 714/776 |
| 2016/0241355 A1 | 8/2016 | Mahdavifar et al. | |
| 2017/0214416 A1* | 7/2017 | Ge | H03M 13/2927 |
| 2018/0323905 A1* | 11/2018 | Shelby | H03M 13/033 |
| 2019/0363828 A1 | 11/2019 | Kudekar et al. | |

OTHER PUBLICATIONS

Hamed H.S., et al., "Universal Polar Codes," IEEE International Symposium on Information Theory, Jun. 29, 2014, pp. 1451-1455, XP032635600.

Li B., et al., "ARM-Polar Codes," Jul. 21, 2014, 2 pages, XP055270196, Retrieved from the Internet: URL: https://arxiv.org/ftp/arvix/papers/1407/1407.5483.pdf [retrieved on May 3, 2016].

Marco M., et al., "From Polar to Reed-Muller Codes: A Technique to Improve the Finite-Length Performance," IEEE Transactions on Communications, vol. 62 (9), Sep. 2014, pp. 3084-3091, XP011559575.

Partial International Search Report—PCT/US2018/013901—ISA/EPO—Jun. 4, 2018.

* cited by examiner

ROBUST AND UNIVERSAL POLAR CODES

PRIORITY CLAIM

This application claims priority to and the benefit of Provisional Patent Application No. 62/447,343 filed in the U.S. Patent and Trademark Office on Jan. 17, 2017, the entire content of which is incorporated herein by reference as if fully set forth below in its entirety and for all applicable purposes.

TECHNICAL FIELD

The technology discussed below relates generally to wireless communication systems, and more particularly, to channel coding utilizing polar codes in wireless communication systems.

INTRODUCTION

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for next generation networks (e.g., 5G or New Radio (NR) networks), a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of wireless communication networks beyond LTE.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for the construction of robust and universal polar codes. In one aspect of the disclosure, a plurality of synthetic channels utilized for transmission of a polar codeword over an air interface may be sorted in order of reliability utilizing a convex combination of the mutual information calculated for each synthetic channel based on an Additive White Gaussian Noise (AWGN) channel and a binary erasure channel. In another aspect of the disclosure, the plurality of synthetic channels may be sorted in order of reliability utilizing cumulative sums calculated for each synthetic channel. In some examples, each cumulative sum may be calculated from a binary representation of a position of the synthetic channel within an order of synthetic channels.

In one aspect of the disclosure, a method of polar coding at a transmitting wireless communication device is provided. The method includes computing respective first mutual information for each synthetic channel of a set of synthetic channels based on an underlying Additive White Gaussian Noise (AWGN) channel, computing respective second mutual information for each synthetic channel of the set of synthetic channels based on an underlying binary erasure channel, and computing a respective metric for each synthetic channel of the set of synthetic channels based on a convex combination of the respective first mutual information and the respective second mutual information. The method further includes sorting the set of synthetic channels in order of reliability based on the respective metrics to produce an order of synthetic channels, identifying K best synthetic channels of the set of synthetic channels in accordance with the order of synthetic channels, placing information bits within information bit locations of an information block corresponding to the K best synthetic channels, placing frozen bits within frozen bit locations of the information block corresponding to N−K synthetic channels, polar coding the information block to produce a polar codeword, and transmitting the polar codeword to a receiving wireless communication device over a wireless air interface.

Another aspect of the disclosure provides an apparatus configured for polar coding. The apparatus includes a processor, a memory communicatively coupled to the processor, and a transceiver communicatively coupled to the processor. The processor is configured to compute respective first mutual information for each synthetic channel of a set of synthetic channels based on an underlying Additive White Gaussian Noise (AWGN) channel, compute respective second mutual information for each synthetic channel of the set of synthetic channels based on an underlying binary erasure channel, and compute a respective metric for each synthetic channel of the set of synthetic channels based on a convex combination of the respective first mutual information and the respective second mutual information. The processor is further configured to sort the set of synthetic channels in order of reliability based on the respective metrics to produce an order of synthetic channels, identify K best synthetic channels of the set of synthetic channels in accordance with the order of synthetic channels, place information bits within information bit locations of an information block corresponding to the K best synthetic channels, place frozen bits within frozen bit locations of the information block corresponding to N−K synthetic channels, polar code the information block to produce a polar codeword, and transmit the polar codeword to a receiving wireless communication device over a wireless air interface via the transceiver.

Another aspect of the disclosure provides a method of polar coding at a transmitting wireless communication device. The method includes calculating a respective cumulative sum for each synthetic channel of a set of synthetic channels, sorting the set of synthetic channels in order of reliability based on the respective cumulative sums to produce an order of synthetic channels, identifying K best synthetic channels of the set of synthetic channels in accordance with the order of synthetic channels, placing information bits within information bit locations of an information block corresponding to the K best synthetic channels, placing frozen bits within frozen bit locations of the information block corresponding to N−K synthetic channels, polar coding the information block to produce a polar codeword, and transmitting the polar codeword to a receiving wireless communication device over a wireless air interface.

Another aspect of the disclosure provides an apparatus configured for polar coding. The apparatus includes a processor, a memory communicatively coupled to the processor, and a transceiver communicatively coupled to the processor. The processor is configured to calculate a respective cumulative sum for each synthetic channel of a set of synthetic channels, sort the set of synthetic channels in order of reliability based on the respective cumulative sums to produce an order of synthetic channels, identify K best synthetic channels of the set of synthetic channels in accordance with the order of synthetic channels, place information bits within information bit locations of an information block corresponding to the K best synthetic channels, place frozen bits within frozen bit locations of the information block corresponding to N−K synthetic channels, polar code the information block to produce a polar codeword, and transmit the polar codeword to a receiving wireless communication device over a wireless air interface via the transceiver.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
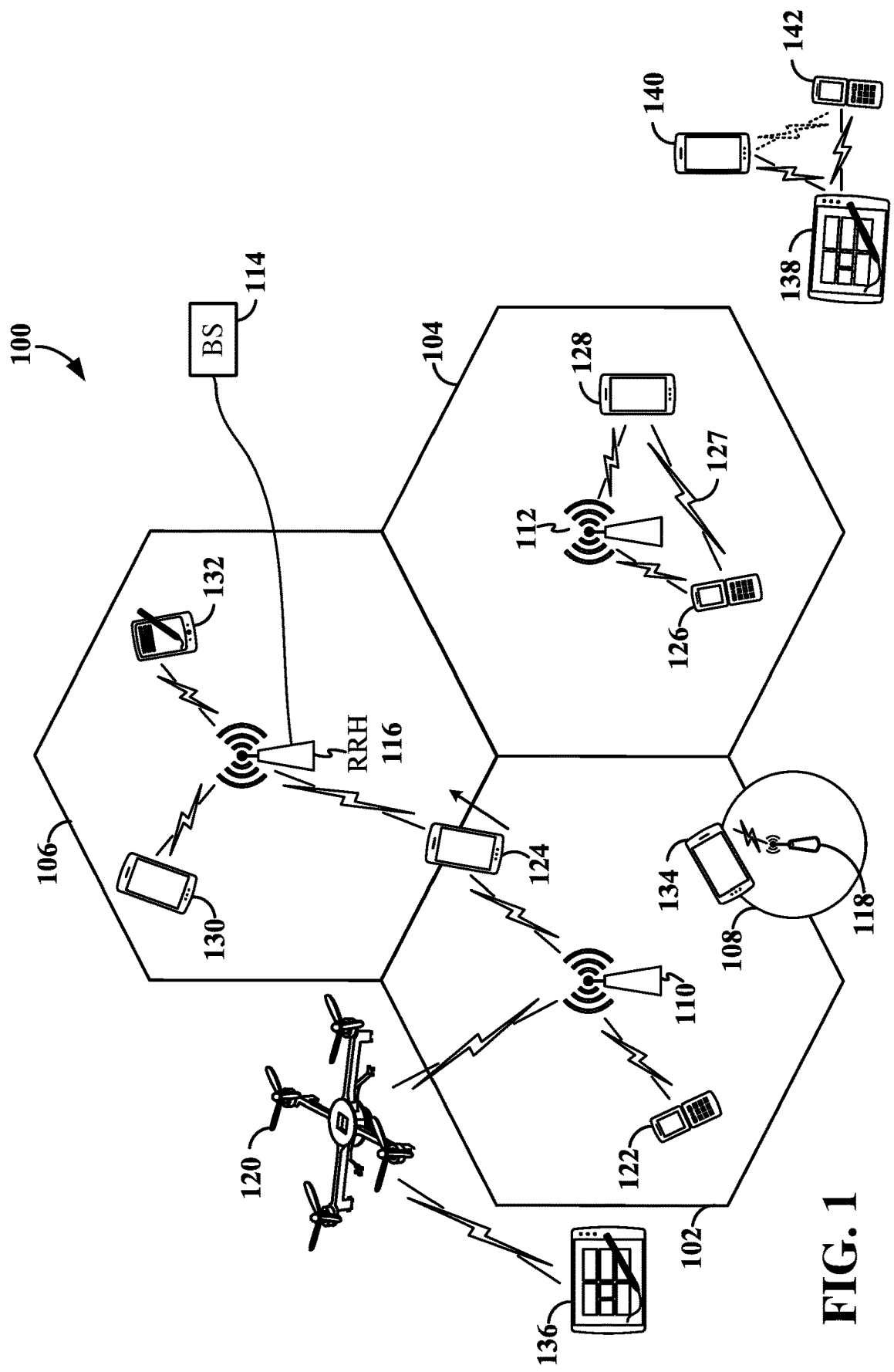
FIG. 1 is a diagram illustrating an example of a radio access network.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. In some examples, the radio access network 100 may be a network employing wireless communication technologies. This may include, for example, a fifth generation (5G) or New Radio (NR) wireless communication technology based on a set of standards (e.g., issued by 3GPP, www.3gpp.org). For example, standards defined by the 3GPP following LTE-Advanced or by the 3GPP2 following CDMA2000 may be considered 5G. Standards may also include pre-3GPP efforts specified by Verizon Technical Forum and Korea Telecom SIG.

In other examples, the radio access network 100 may be a network employing a third generation (3G) wireless communication technology or a fourth generation (4G) wireless communication technology. For example, standards promulgated by the 3rd Generation Partnership Project (3GPP) and the 3rd Generation Partnership Project 2 (3GPP2) may be considered 3G or 4G, including but not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, a medical device, implantable devices, industrial equipment, and many other devices sized, shaped, and configured for use by users.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. UEs may comprise a number of hardware structural components sized, shaped, and arranged to help in communication; such components can include antennas, antenna arrays, RF chains, amplifiers, one or more processors, etc. electrically coupled to each other.

In another example, a mobile network node (e.g., quadcopter 120) may be configured to function as a UE. For example, the quadcopter 120 may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), discrete Fourier transform spread orthogonal frequency division multiple access (DFT-s-OFDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), discrete Fourier transform spread orthogonal frequency division multiplexing (DFT-s-OFDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication. In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. If the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe/slot timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. If the signal strength or quality of the pilot signal measured by a neighboring cell exceeds that of the signal strength or quality measured by the serving cell, the radio access network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
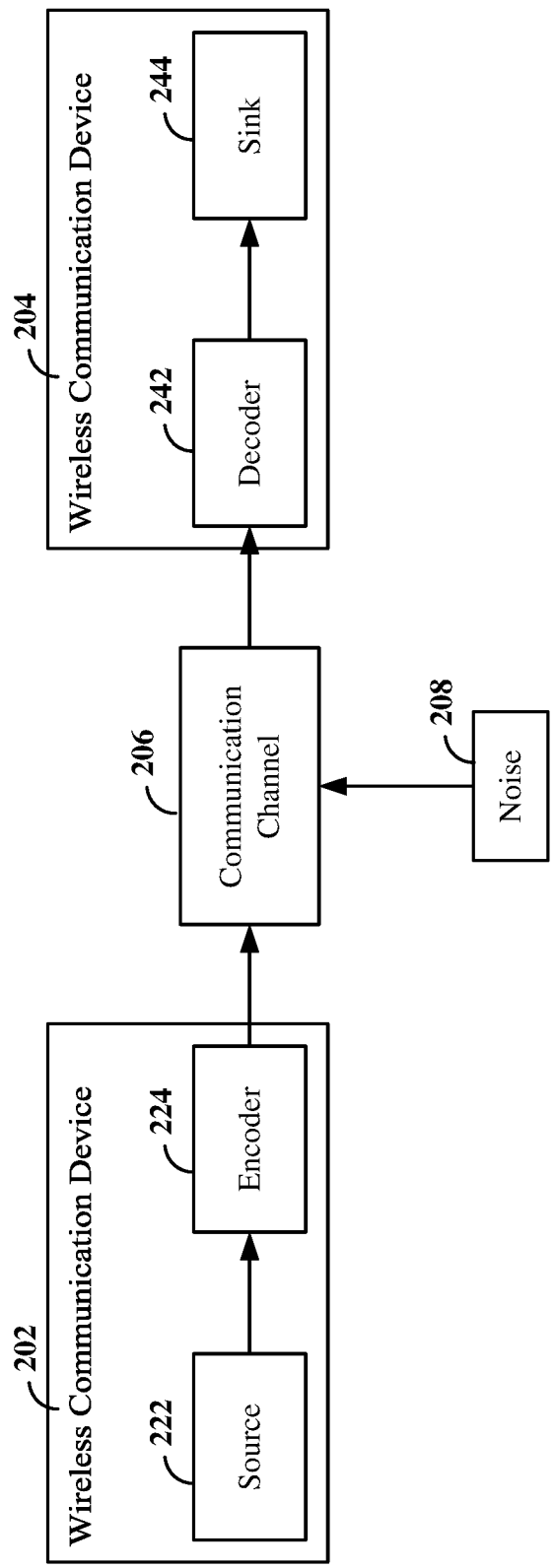
FIG. 2 is a schematic illustration of wireless communication utilizing block codes according to some aspects of the present disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. One issue in such a scheme that must be addressed to provide for reliable communication of the digital message, is to take into account the noise 208 that affects the communication channel 206.

Block codes, or error correcting codes are frequently used to provide reliable transmission of digital messages over such noisy channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the coding rate R is the ratio between the message length and the block length: i.e., R=K/N. Exploitation of this redundancy in the encoded information message is the key to reliability of the message, enabling correction for any bit errors that may occur due to the noise. That is, a decoder 242 at the second (receiving) wireless communication device 204 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for next generation networks (e.g., NR networks), a new category of block codes, called polar codes, presents a potential opportunity for reliable and efficient information transfer with improved performance relative to turbo codes and LDPC codes.

Polar codes are linear block error correcting codes. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes (N, K). The codeword length N is a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

For example, an original information block may be represented as an information bit vector $u=(u_1, u_2, u_N)$. The polar encoder 224 may polar code the information bit vector to produce the polar code block as an encoded bit vector $x=(x_1, x_2, \ldots, x_N)$ using a generating matrix $G_N=B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \ldots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & & 1 & 1 & 0 & 0 \\ 1 & 0 & 1 & \cdots & 1 & 0 & 1 & 0 \\ 1 & 1 & 1 & & 1 & 1 & 1 & 1 \end{bmatrix}$$

The polar encoder 224 may then generate the polar code block as:

$$x_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar code block x. In some examples, the information bit vector u may include a number of information bits, denoted K, and a number of frozen bits, denoted $\mathcal{F}$. Frozen bits are bits that are set to a suitable predetermined value. Thus, the value of the frozen bits may generally be known at both the transmitting device and the receiving device. The polar encoder 224 may determine the number of information bits and the number of frozen bits based on the code rate R. For example, the polar encoder 224 may select a code rate R from a set of one or more code rates and select K=N×R bits in the information block to transmit information. The remaining (N−K) bits in the information block may then be fixed as frozen bits $\mathcal{F}$.

In order to determine which information block bits to set as frozen bits, the polar encoder 224 may further analyze the wireless channel over which the polar code block may be sent. For example, the underlying wireless channel for transmitting the polar code block may be transformed into a set of synthetic channels, such that each encoded bit in the polar code block is transmitted over one of the synthetic channels. Thus, each synthetic channel may correspond to a particular coded bit location in the polar code block (e.g., synthetic channel 1 may correspond to coded bit location containing coded bit $x_1$).

For example, let W: $\mathcal{X} \to \mathcal{Y}$ be a wireless channel W with input random variables X taken from an input alphabet $\mathcal{X}$ and output random variables Y taken from an output alphabet $\mathcal{Y}$. To perform channel polarization, two identical copies of the channel W may be mapped into a pair of synthetic channels $W^0$ and $W^1$, given by:

$$W^0(y_0, y_1 | x_0) = \Sigma_{x_1} \frac{1}{2} W(y_0 | x_0 \oplus x_1) W(y_1 | x_1) \text{ and}$$

$$W^1(y_0, y_1 | x_0, x_1) = \frac{1}{2} W(y_0 | x_0 \oplus x_1) W(y_1 | x_1),$$

where $x \in \mathcal{X}$ and $y \in \mathcal{Y}$. The synthetic channel $W^0$ is less reliable than the underlying channel W and the synthetic channel $W^1$ is more reliable than the underlying channel W. By iterating this operation n times, a polar code of length $N=2^n$ may be obtained. In other words, N identical copies of the underlying channel W may be transformed into N synthetic channels $W^{(i)}$ for $0 \le i \le N-1$. More specifically, let $(i_0, i_1, \ldots, i_{n-1})$ be the binary expansion of the integer i with $i_0$ corresponding to the most-significant bit and $i_{(n-1)}$ corresponding to the least significant bit. Then, the set of synthetic channels $W_N^{(i)}$ may defined as $(((W^{i_0})^{i_1}) \cdots )^{i_{(n-1)}}$.

The polar encoder 224 may identify the K best synthetic channels (e.g., the K most reliable synthetic channels) for transmitting the information bits using any of a number of techniques, including, for example, density evolution, Gaussian approximation, or a degrading/upgrading method. One example of a degrading/upgrading method involves measuring the reliability of the channel based on the mutual information of the channel I(W). Here, the mutual information refers to the reduction in uncertainty in X due to knowledge of Y, or put another way, the measure of the dependency between the random variables X and Y. For example, let $I^i(W)$ denote the mutual information of the $i^{th}$ synthetic channel. Based on the mutual information measurement of each synthetic channel, the K most reliable synthetic channels (e.g., the synthetic channels with the highest $I^i(W)$) may be chosen to transmit the K information bits.

The polar encoder 224 may then determine the original bit locations in the information block contributing to (or corresponding to) the K best synthetic channels. For example, based on the generating matrix, one or more of the original bits of the information block may contribute to each of the coded bits of the polar code block. Thus, based on the generating matrix, the polar encoder 224 may determine K original bit locations in the information block corresponding to the K best synthetic channels, designate the K original bit locations in the information block for information bits and designate the remaining original bit locations in the information block for fixed bits.

The polar encoder 224 may then set the original bit locations of the information block corresponding to the K best synthetic channels as including information bits and the remaining original bit locations corresponding to the N−K synthetic channels (e.g., "bad" synthetic channels) as including frozen bits. Bit-reversal permutation may then be performed by applying the bit-reversal permutation matrix $B_N$ described above to the N bits (including K information bits and N−K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar code block. The polar encoder 224 may then transmit the polar code block to the receiving wireless communication device 204.

The receiving wireless communication device 204 receives y, which is a noisy version of x, and the decoder 242 has to decode y or, equivalently, u, using a successive cancellation (SC) decoding algorithm. Successive cancellation decoding algorithms typically have a decoding complexity of O (N log N) and can achieve Shannon capacity when N is very large. However, for short and moderate block lengths, the error rate performance of polar codes significantly degrades.

Therefore, in some examples, the polar decoder 242 may utilize a SC-list decoding algorithm to improve the polar coding error rate performance. With SC-list decoding, instead of only keeping one decoding path (as in simple SC decoders), L decoding paths are maintained, where L>1. At each decoding stage, the polar decoder 242 discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the polar decoder 242 will have a list of L candidates for $u_1^N$, out of which the most likely candidate is selected. Thus, when the polar decoder 242 completes the SC-list decoding algorithm, the polar decoder 342 returns a single information block to the sink 244.

Traditional polar codes of a given code rate R are typically constructed assuming the underlying channel is an Additive White Gaussian Noise (AWGN) channel with a Signal-to-Noise ratio (SNR) tuned to the capacity (which may be equal to the code rate R). For example, by considering an AWGN channel with SNR tuned to the capacity R, the K best synthetic channels may be identified based on the mutual information $I^i(AWGN)$. However, direct use of such an encoding scheme in practical wireless systems has several drawbacks. In particular, polar codes designed for the AWGN channel may not perform well over fading wireless channels, where an occasional deep fade might wipe out or erase some information. Hence, it may be desirable to construct polar codes that are more suited for transmission over fading channels, and yet have the ease of the traditional construction. In addition, in next-generation wireless networks, such as NR networks, coding schemes may be required to support a very large range of rates. For peak data transmission speeds, rates as high as 8/9 may be needed. Furthermore, for extended cellular coverage, rates as low as 1/12 may be needed. Designing polar codes for every possible rate may result in wireless communication devices incurring a storage penalty. Therefore, it may also be desirable to construct polar codes that are SNR independent (e.g., universal) and yet have a performance close to the traditionally designed polar code.

Therefore, in various aspects of the disclosure, polar codewords may be constructed by assuming not only an underlying AWGN channel, but also an underlying binary erasure channel (BEC), which is more robust to fading channels. In some examples, the synthetic channels may be sorted in order of reliability by utilizing a convex combination of the mutual information calculated for each synthetic channel based on an underlying Additive White Gaussian Noise (AWGN) channel and the mutual information calculated for each synthetic channel based on an underlying BEC. The BEC can model the situation where some information is completely erased.

More precisely, a polar code of code rate R may be constructed by considering the AWGN channel with a SNR tuned to the capacity (which may be equal to the code rate R), and computing the respective mutual information $I^i(AWGN)$ of the synthetic channels for $0 \le i \le N-1$. Then, the BEC($\in$) may be considered with an erasure probability of $\in = 1-R$, and the respective mutual information $I^i(BEC)$ of the synthetic channels for $0 \le i \le N-1$ may be computed. Next, a metric for each synthetic channel may be computed based on a convex combination of the mutual information computed for the AWGN channel and the mutual information computed for the BEC. For example, for a given $\alpha$, and for each synthetic channel, the convex combination, $\alpha I^i(AWGN)+(1-\alpha)I^i(BEC)$, may be computed. Finally, the K best synthetic channels with the highest metric given by $\alpha I^i(AWGN)+(1-\alpha)I^i(BEC)$ may be selected to transmit the K information bits. In some examples, the value of a may be chosen so that the performance over each of the AWGN channel and the BEC is not significantly degraded. For example, the value of a may be selected to provide comparable performance over the AWGN channel and the BEC. One example value of $\alpha$ is 0.3. It should be understood that other values of a may also be utilized.

In other aspects of the disclosure, polar codewords may be constructed that are independent of the underlying channel, and as such, universal. In some examples, the synthetic channels may be sorted in order of reliability utilizing cumulative sums calculated for each synthetic channel. For example, each cumulative sum may be calculated from a binary representation of a position of the synthetic channel within the set of synthetic channels $W^{(i)}$.

In this example, the notation $W^1 < W^2$ may be used to indicate that the synthetic channel $W^1$ is degraded with respect to the synthetic channel $W^2$. It can be easily shown that the synthetic channel corresponding to position 0 ($W^{(0)}$) with a binary representation of all 0's is the worst synthetic channel and the synthetic channel corresponding to the position N−1 ($W^{(N-1)}$) with a binary representation of all 1's is the best synthetic channel. More precisely, $W^{(i)}$ is upgraded with respect to $W^{(0)}$ and degraded with respect to $W^{(N-1)}$ for all i. However, it is not clear what the order is for the other synthetic channels since the ordering typically depends on the underlying channel.

To construct a universal polar code using the cumulative sum of the binary representation of the synthetic channel, let $(i_0, i_1, \ldots i_{n-1})$ be the binary representation of the position i of a synthetic channel within the set of synthetic channels. Then, the cumulative sum, denoted by $a^{(i)}$, may be calculated as a vector of size n, with the $m^{th}$ component, $a_m^{(i)}$, given by $a_m^{(i)} = \sum_{t=0}^{m-1} i_t$. For example, if n=5, then the synthetic channel position twenty-three has the binary representation (1,0,1,1,1), and the cumulative sum is given by the vector (1,1,2,3,4). The cumulative sum is calculated by adding the value of the $m^{th}$ component of the binary representation of the synthetic channel position to the value of the $(m-1)^{th}$ component in the cumulative sum vector. In the above example for a synthetic channel at position twenty-three, the first component in the cumulative sum is equal to the first component in the binary representation (e.g., 1). The second component in the cumulative sum is equal to the sum of first component in the cumulative sum (e.g., 1) and the second component in the binary representation (e.g., 0). Here, the second component is 1+0=1. The third component in the cumulative sum is equal to the sum of the second component in the cumulative sum (e.g., 1) and the third component in the binary representation (e.g., 1). Thus, the third component in the cumulative sum is 1+1=2. Additional components may be similarly calculated.

From the above, it is evident that the cumulative sum imposes a partial order on the synthetic channels. More precisely, it can be gleaned that $W^{(i)} < W^{(j)}$ if $a^{(i)} < a^{(j)}$, where $a^{(i)} < a^{(j)}$ if $a_m^{(i)} < a_m^{(j)}$ for all $0 \le m \le n-1$. In other words, the synthetic channel at position j is upgraded with respect to the synthetic channel at position i if the cumulative sum for the synthetic channel at position j is component-wise greater than the cumulative sum for the synthetic channel at position i. However, if the cumulative sum for the synthetic channel at position j is not component-wise greater than the cumulative sum for the synthetic channel at position i, then it is not clear which synthetic channel is more reliable in terms of degradation, and further comparisons with other synthetic channel positions may be conducted to determine the order of the synthetic channels at positions i and j. It should be noted that this partial order as defined by the cumulative sum is independent of the underlying channel W, and hence, universal.

Based on the cumulative sums of each of the synthetic channels, a total order of the set of the synthetic channels may be defined. As indicated above, if $a_m^{(i)} < a_m^{(j)}$ for all m, then the synthetic channel at position j is more reliable than the synthetic channel position i. More generally, the synthetic channel at position j is more reliable than the synthetic channel at position i if $\Sigma_m(a_m^{(j)} - a_m^{(i)}) > 0$. Note that when $a_m^{(j)} > a_m^{(i)}$ for all m, then $\Sigma_m(a_m^{(j)} - a_m^{(i)}) > 0$ is trivially satisfied and the synthetic channel at position j is more reliable than the synthetic channel at position i in terms of degradation.

However, if $\Sigma_m(a_m^{(j)} - a_m^{(i)}) = 0$, then the order may be determined by considering the cumulative sum components individually. In one example, the components of the cumulative sums of the synthetic channels at positions i and j may be individually compared starting with the last component. For example, if $a_n^{(j)} > a_n^{(i)}$, then the synthetic channel at position j is considered more reliable, and if $a_n^{(i)} > a_n^{(j)}$, then the synthetic channel at position i is considered more reliable. However, if $a_n^{(j)} = a_n^{(i)}$, then the next components, $a_{n-1}^{(j)}, a_{n-1}^{(i)}$ are compared and so on. Since i≠j, there will be at least one component where the cumulative sums will differ and the more reliable synthetic channel may be determined.

In another example, the components of the cumulative sums of the synthetic channels at positions i and j may be individually compared starting with the first component. For example, if $\Sigma_m(a_m^{(j)} - a_m^{(i)}) = 0$, and $a_1^{(j)} > a_1^{(i)}$ then the synthetic channel at position j is considered more reliable, and if $a_1^{(i)} > a_1^{(j)}$, then the synthetic channel at position i is considered more reliable. However, if $a_1^{(j)} > a_1^{(i)}$, then the next components, $a_2^{(j)}, a_2^{(i)}$ are compared and so on. Other mechanisms may also be used to determine which synthetic channel is more reliable when the sum of the differences between the individual components is equal to zero, and the present disclosure is not limited to any particular mechanism.

The above comparison of the cumulative sums of the positions of synthetic channels within the set of synthetic channels imposes a total order on the synthetic channels. For example, if the synthetic channel at position i is found to be more reliable than the synthetic channel at position j and the synthetic channel at position j is found to be more reliable than the synthetic channel at position k, according to the above metric, the synthetic channel at position i can be considered to be more reliable than the synthetic channel at position k. In particular, if $\Sigma_m(a_m^{(i)} - a_m^{(j)}) > 0$ and $\Sigma_m(a_m^{(j)} - a_m^{(k)}) > 0$, then the addition of the two inequalities results in $\Sigma_m(a_m^{(i)} - a_m^{(k)}) > 0$, which implies that the synthetic channel at position i is more reliable than the synthetic channel at position k. From the resulting order of synthetic channels, the K best synthetic channels may be selected to transmit the K information bits.

Figure 3:
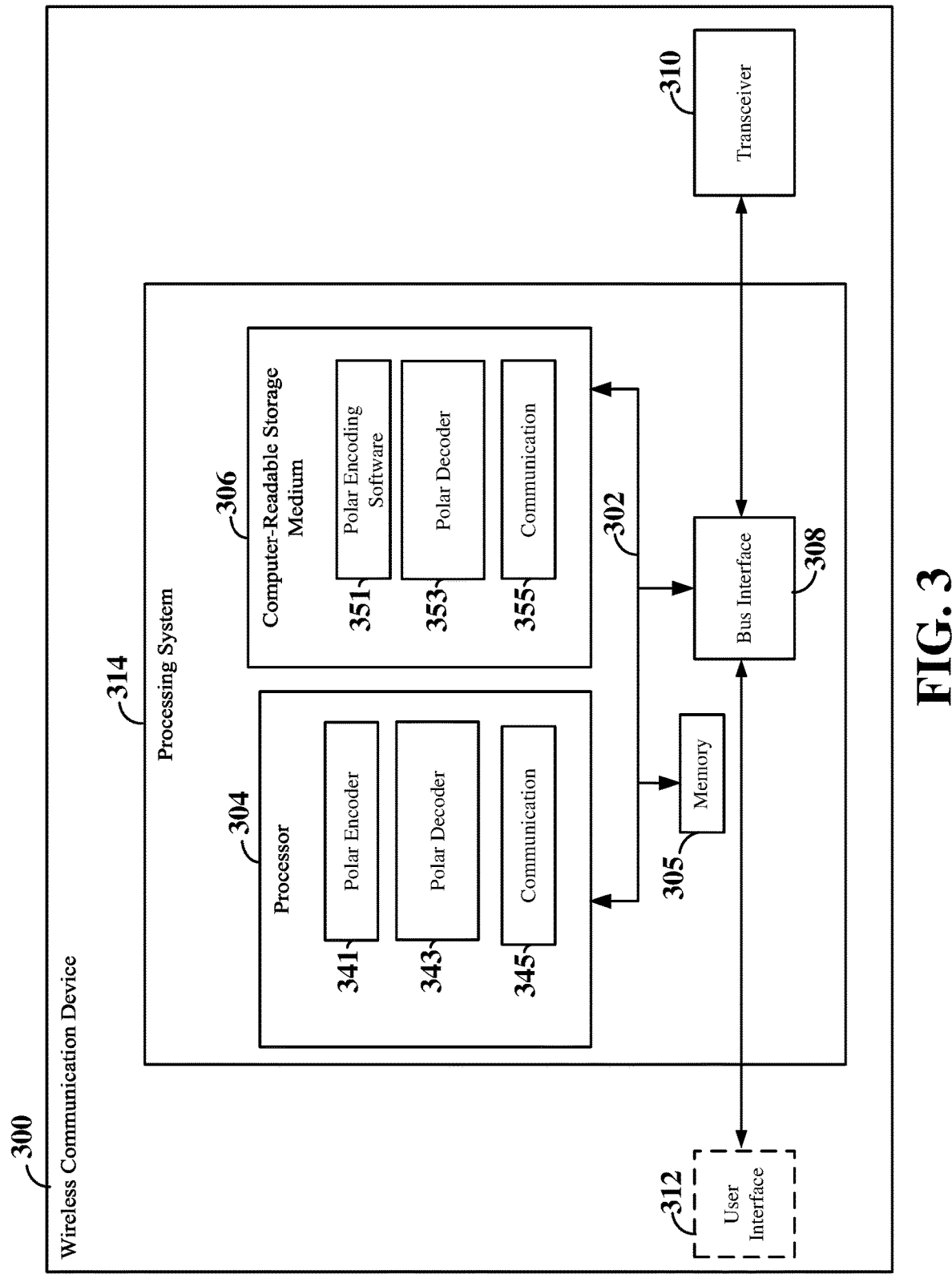
FIG. 3 is a block diagram illustrating an example of a hardware implementation for a wireless communication device employing a processing system according to some aspects of the present disclosure.

FIG. 3 is a block diagram illustrating an example of a hardware implementation for a wireless communication device 300 employing a processing system 314. For example, the wireless communication device 300 may be a user equipment (UE), a base station, or any other suitable apparatus or means for wireless communication.

In accordance with various aspects of the disclosure, an element, or any portion of an element, or any combination of elements may be implemented with a processing system 314 that includes one or more processors 304. The term "processor" or "processors" may be used herein according to the structural meaning thereof. Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described herein. The processor 304 may in some instances be implemented via a baseband or modem chip and in other implementations, the processor 304 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable medium 306). The bus 302 may also link various other circuits such as timing sources, peripherals, voltage regulators, and power management circuits, which are well known in the art, and therefore, will not be described any further. A bus interface 308 provides an interface between the bus 302 and a transceiver 310. The transceiver 310 provides a means for communicating with various other apparatus over a transmission medium. Depending upon the nature of the apparatus, an optional user interface 312 (e.g., keypad, display, speaker, microphone, joystick) may also be provided.

The processor 304 is responsible for managing the bus 302 and general processing, including the execution of software stored on the computer-readable medium 306. The software, when executed by the processor 304, causes the processing system 314 to perform the various functions described below for any particular apparatus. The computer-readable medium 306 may also be used for storing data that is manipulated by the processor 304 when executing software. In some examples, the computer-readable medium 1006 may be integrated with the memory 1005.

One or more processors 304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on the computer-readable medium 306.

The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer.

The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 304 may include circuitry configured for various functions. For example, the processor 304 may include a polar encoder 341, which may in some examples operate in coordination with polar encoding software 351 stored in the computer-readable storage medium 306. The polar encoder 341 may be configured to polar code an information block to produce a polar codeword having a codeword length of N.

In various aspects of the present disclosure, the polar encoder 341 may be configured to construct polar codes by assuming not only an underlying AWGN channel, but also an underlying binary erasure channel (BEC). In some examples, the polar encoder 341 may be configured to construct a polar codeword of code rate R by considering an Additive White Gaussian Noise (AWGN) channel with a signal-to-noise ratio (SNR) tuned to the capacity (which is equal to the code rate R), and computing the mutual information of each of the synthetic channels within a set of N synthetic channels, where N corresponds to the codeword length, based on the underlying AWGN channel. The polar encoder 341 may then consider the BEC($\in$) with an erasure probability of $\in$=1−R, and compute the mutual information for each of the synthetic channels within the set of synthetic channels based on the underlying BEC.

The polar encoder 341 may further compute a metric for each synthetic channel based on a convex combination of the mutual information computed for the AWGN channel and the BEC. For example, for each synthetic channel, the convex combination, $\alpha I^i(AWGN)+(1-\alpha)I^i(BEC)$, may be computed, where $\alpha$ is selected to provide comparable performance over the AWGN channel and the BEC. The polar encoder may then identify the K best synthetic channels with the highest metric to transmit the K information bits.

In other aspects of the disclosure, the polar encoder 341 may be configured to construct polar codes that are independent of the underlying channel. In some examples, the polar encoder 341 may be configured to calculate a cumulative sum for each synthetic channel of a set of N synthetic channels, where N corresponds to the codeword length. For example, each cumulative sum may be calculated from a binary representation of a position of the synthetic channel within the set of synthetic channels. The binary representation of the synthetic channel position has a size (e.g., number of components) equal to the size (e.g., number of components) of the cumulative sum. The cumulative sum is calculated by adding the value of the mth component of the binary representation of the synthetic channel position to the value of the (m−1)th component in the cumulative sum to produce the value of the mth component in the cumulative sum.

The polar encoder 341 may further be configured to sort the synthetic channels into an order of synthetic channels based on the respective cumulative sums. In some examples, the order of synthetic channels may be determined by comparing the cumulative sums of different synthetic channels, and upgrading or degrading the synthetic channels with respect to one another based on the cumulative sum comparisons. More specifically, the polar encoder 341 may be configured to compare corresponding components in the cumulative sums of two synthetic channels and upgrade one of the synthetic channels with respect to the other synthetic channel in the order of synthetic channels based on the comparison. Here, upgrade refers to the ordering of the synthetic channels in terms of reliability (e.g., a synthetic channel with a higher reliability is upgraded with respect to or placed ahead of a synthetic channel with a lower reliability, as determined from the comparison, in the order of synthetic channels).

For example, the polar encoder 341 may upgrade a synthetic channel at a later position (e.g., position j) within the set of synthetic channels with respect to the synthetic channel at an earlier position (e.g., position i) if the cumulative sum for the synthetic channel at position j is component-wise greater than the cumulative sum for the synthetic channel at position i. However, if the cumulative sum for the synthetic channel at position j is not component-wise greater than the cumulative sum for the synthetic channel at position i, then it is not clear which synthetic channel is more reliable in terms of degradation, and the polar encoder 341 may be configured to perform further comparisons with other synthetic channel cumulative sums to determine the order of the synthetic channels at positions i and j.

As another example, the polar encoder 341 may calculate a respective difference between each set of corresponding components in the cumulative sums of two synthetic channels. The polar encoder 341 may then calculate a sum of the respective differences between the corresponding components in the cumulative sums and upgrade one of the synthetic channels with respect to the other synthetic channel in the order of synthetic channels based on the calculated sum. For example, if the sum of the respective differences between the corresponding cumulative sum components of a synthetic channel at position j (later position) and a synthetic channel at position i (earlier position) is greater than zero, the polar encoder 341 may upgrade the synthetic channel at position j with respect to the synthetic channel at position i. However, if the sum of the respective differences between the corresponding cumulative sum components of the synthetic channel at position j and the synthetic channel at position i is less than zero, then it is not clear which synthetic channel is more reliable in terms of degradation, and the polar encoder 341 may be configured to perform further comparisons with other synthetic channel cumulative sums to determine the order of the synthetic channels at positions i and j.

If the sum of the respective differences between the corresponding cumulative sum components of the synthetic channel at position j and the synthetic channel at position i is equal to zero, the polar encoder 341 may determine the order of the synthetic channels at positions i and j by considering the cumulative sum components individually. In one example, the components of the cumulative sums of the synthetic channels at positions i and j may be individually compared starting with the last component. In another example, the components of the cumulative sums of the synthetic channels at positions i and j may be individually compared starting with the first component. Other mechanisms may also be used to determine which synthetic channel is more reliable if the sum of the differences between the individual components is equal to zero, and the present disclosure is not limited to any particular mechanism.

The above comparison of the cumulative sums of the positions of synthetic channels within the set of synthetic channels imposes a total order on the synthetic channels. For example, if the synthetic channel at position i is found to be more reliable than the synthetic channel at position j (e.g., upgraded with respect to the synthetic channel at position i), and the synthetic channel at position j is found to be more reliable than the synthetic channel at position k (e.g., upgraded with respect to the synthetic channel at position k), the polar encoder 341 may sort the synthetic channels in order of reliability (e.g., from highest reliability to lowest reliability) as follows: (1) synthetic channel at position i; (2) synthetic channel at position j; and (3) synthetic channel at position k. Based on the ordered synthetic channels, the polar encoder 341 may identify the K best synthetic channels.

In either of the above polar code construction mechanisms, once the K best synthetic channels are identified, the polar encoder 341 may place information bits within information bit locations of an information block corresponding to the K best synthetic channels and place frozen bits within frozen bit locations of the information block corresponding to the N−K synthetic channels. The polar encoder 341 may then polar code the resulting information block to produce a polar codeword of length N. The polar codeword may then be further processed and transmitted to a receiving wireless communication device via the transceiver 310.

Further, the processor 304 may include a polar decoder 343, which may in some examples operate in coordination with polar decoding software 353 stored in the computer-readable medium 306. The polar decoder 343 may be configured to receive a polar codeword and decode the polar codeword to produce the original information block. In some examples, the polar decoder 343 may perform successive cancellation (SC) polar decoding or SC polar list decoding to decode the polar codeword.

The processor 304 may further include communication circuitry 345. The communication circuitry 345 may include one or more hardware components that provide the physical structure that performs various processes related to wireless communication (e.g., signal reception and/or signal transmission) as described herein. For example, the communication circuitry 345 may be configured to transmit and/or receive a codeword encoded utilizing polar coding via the transceiver 310. The communication circuitry 345 may operate in coordination with communication software 355.

The circuitry included in the processor 304 is provided as non-limiting examples. Other means for carrying out the described functions exists and is included within various aspects of the present disclosure. In some aspects of the disclosure, the computer-readable medium 306 may store computer-executable code with instructions configured to perform various processes described herein. The instructions included in the computer-readable medium 306 are provided as non-limiting examples. Other instructions configured to carry out the described functions exist and are included within various aspects of the present disclosure.

Figure 4:
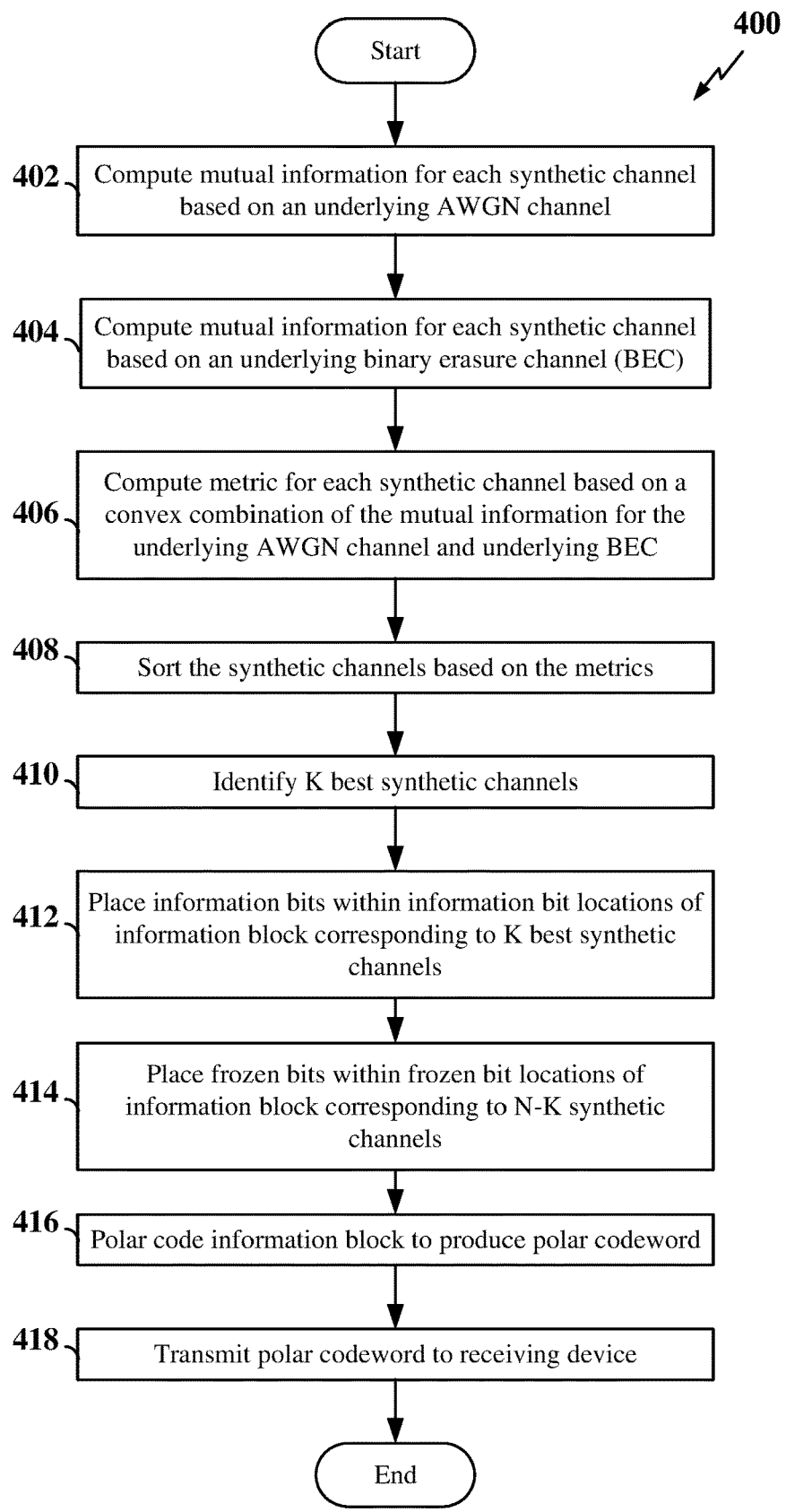
FIG. 4 is a flow chart illustrating an exemplary process for polar coding according to some aspects of the present disclosure.

FIG. 4 is a flow chart illustrating an exemplary process 400 for polar coding according to some aspects of the present disclosure. In some examples, the process 400 may be implemented by a wireless communication device as described above and illustrated in FIGS. 1-3. In some examples, the process 400 may be implemented by any suitable means for carrying out the described functions.

At block 402, the wireless communication device may compute respective mutual information for each synthetic channel of a set of synthetic channels based on an underlying AWGN channel. At block 404, the wireless communication device may compute respective mutual information for each synthetic channel of the set of synthetic channels based on an underlying binary erasure channel (BEC). For example, the polar encoder 341 shown and described above in connection with FIG. 3 may compute the mutual information based on the AWGN channel and BEC.

At block 406, the wireless communication device may compute a respective metric for each synthetic channel of the set of synthetic channels based on a convex combination of the respective mutual information computed based on the underlying AWGN channel and the underlying BEC. In some examples, for each synthetic channel, the convex combination, $\alpha I^i(AWGN)+(1-\alpha)I^i(BEC)$, may be computed, where a is selected to provide comparable performance over the AWGN channel and the BEC. For example, the polar encoder 341 shown and described above in connection with FIG. 3 may compute the respective metrics.

At block 408, the wireless communication device may sort the set of synthetic channels in order of reliability based on the respective metrics to produce an order of synthetic channels. For example, after sorting, the order of synthetic channels may be from highest reliability (e.g., highest metric) to lowest reliability (e.g., lowest metric). For example, the polar encoder 341 shown and described above in connection with FIG. 3 may sort the set of synthetic channels.

At block 410, the wireless communication device may identify the K best synthetic channels based on the order (e.g., the K synthetic channels with the highest metric), and at block 412, the wireless communication device may place information bits within information bit locations of an information block corresponding to the K best synthetic channels (e.g., "good" synthetic channels). At block 414, the wireless communication device may further place frozen bits within frozen bit location of the information block corresponding to the remaining N−K synthetic channels (e.g., "bad" synthetic channels). For example, the polar encoder 341 shown and described above in connection with FIG. 3 may identify the K best synthetic channels, place information bits in bit locations of an information block corresponding to the K best synthetic channels, and place frozen bits in the remaining bit locations of the information block (e.g., in the bit locations corresponding to the remaining N−K synthetic channels).

At block 416, the wireless communication device may polar code the information block to produce a polar codeword, and at block 418, the wireless communication device may transmit the polar codeword to a receiving wireless communication device. For example, the polar encoder 341 shown and described above in connection with FIG. 3 may polar code the information block to produce the polar codeword. In addition, the transceiver 310 shown and described above in connection with FIG. 3 may transit the polar codeword over a wireless air interface to the receiving wireless communication device.

Figure 5:
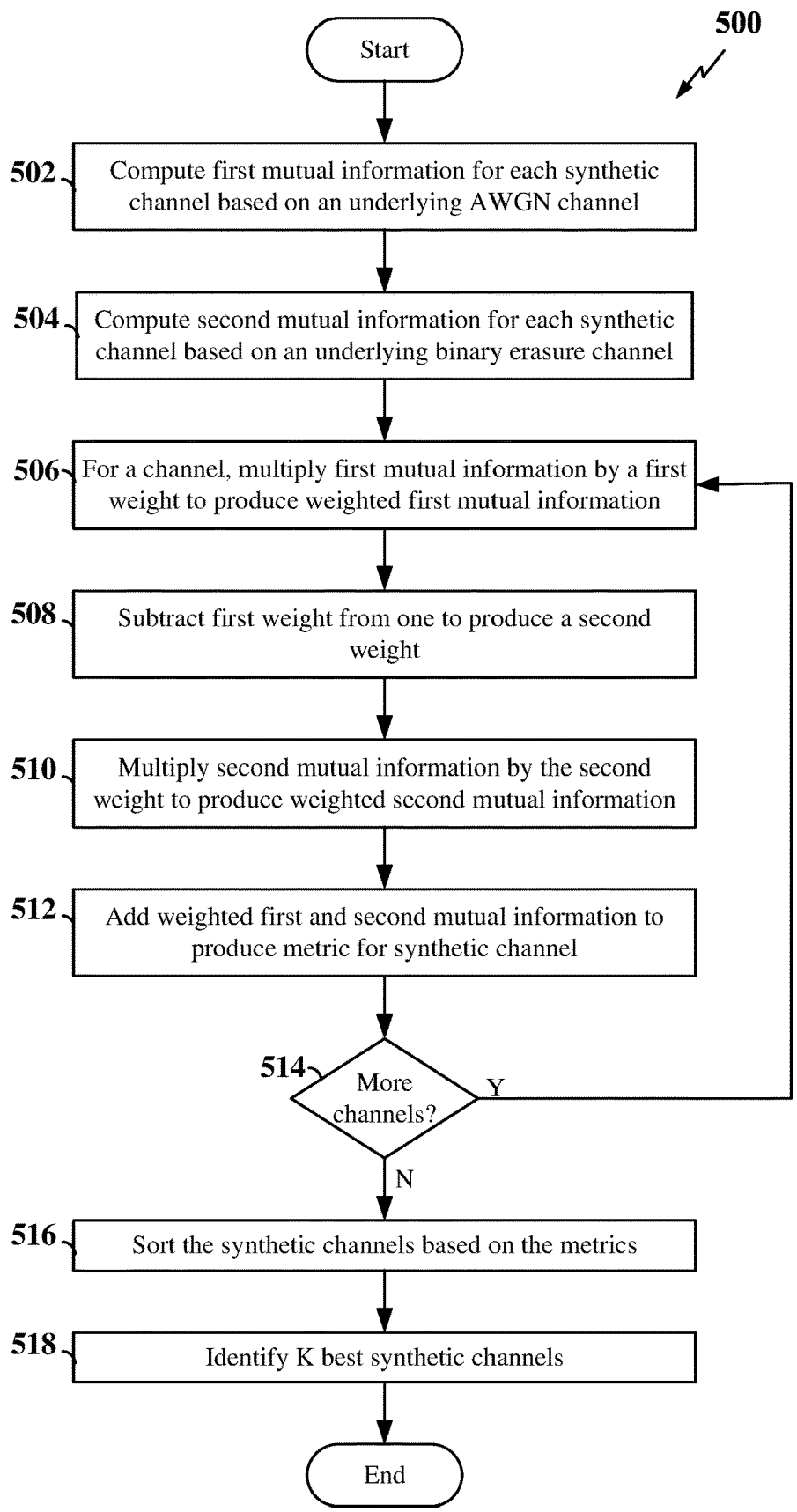
FIG. 5 is a flow chart illustrating an exemplary process for computing a respective metric for each synthetic channel of a set of synthetic channels during polar coding according to some aspects of the present disclosure.

FIG. 5 is a flow chart illustrating an exemplary process 500 for computing a respective metric for each synthetic channel of the set of synthetic channels during polar coding according to some aspects of the present disclosure. In some examples, the process 500 may be implemented by a wireless communication device as described above and illustrated in FIGS. 1-3. In some examples, the process 500 may be implemented by any suitable means for carrying out the described functions.

At block 502, the wireless communication device may compute respective first mutual information for each synthetic channel of a set of synthetic channels based on an underlying AWGN channel. At block 504, the wireless communication device may compute respective second mutual information for each synthetic channel of the set of synthetic channels based on an underlying binary erasure channel (BEC). For example, the polar encoder 341 shown and described above in connection with FIG. 3 may compute the mutual information based on the AWGN channel and BEC.

At block 506, for a synthetic channel of the set of synthetic channels, the wireless communication device may multiply the first mutual information by a first weight to produce weighted first mutual information. At block 508, the wireless communication device may subtract the first weight from one to produce a second weight, and at block 510, multiply the second mutual information by the second weight to produce weighted second mutual information. At block 512, the wireless communication device may add the weighted first mutual information and the weighted second mutual information to produce a metric for the synthetic channel. At block 514, the wireless communication device may determine whether there are more synthetic channels. If there are more synthetic channels (Y branch of block 514), the process repeats at block 506, where the first mutual information for the next channel is multiplied by the first weight. For example, the polar encoder 341 shown and described above in connection with FIG. 3 may compute the respective metrics.

If there are no more synthetic channels (N branch of block 514), the wireless communication device may sort the set of synthetic channels in order of reliability based on the respective metrics to produce an order of synthetic channels. For example, after sorting, the order of synthetic channels may be from highest reliability (e.g., highest metric) to lowest reliability (e.g., lowest metric). For example, the polar encoder 341 shown and described above in connection with FIG. 3 may sort the set of synthetic channels.

At block 518, the wireless communication device may identify the K best synthetic channels based on the order (e.g., the K synthetic channels with the highest metric) for placing information bits during polar coding. For example, the polar encoder 341 shown and described above in connection with FIG. 3 may identify the K best synthetic channels for placing information bits.

Figure 6:
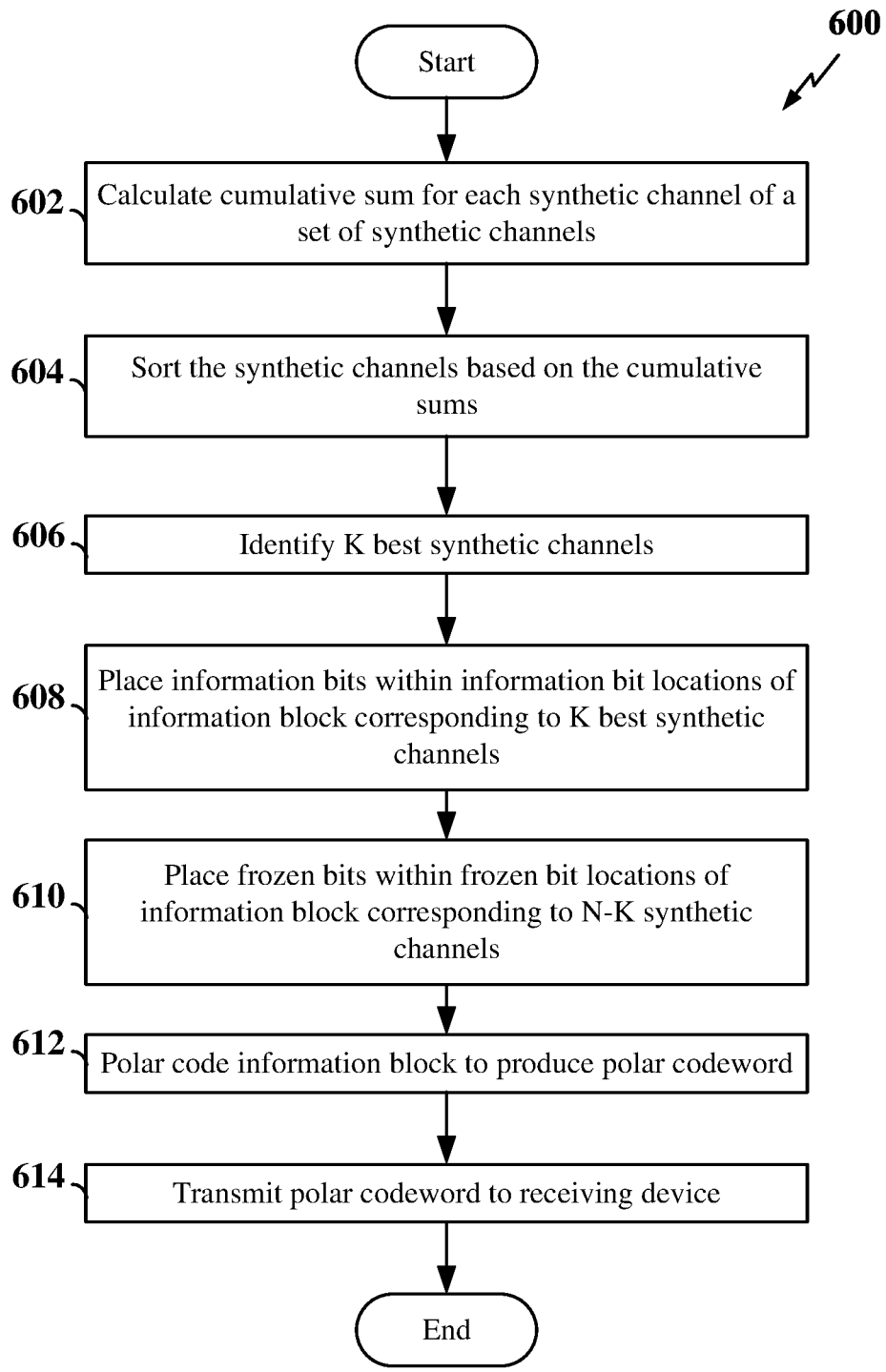
FIG. 6 is a flow chart illustrating another exemplary process for polar coding according to some aspects of the present disclosure.

FIG. 6 is a flow chart illustrating another exemplary process 600 for polar coding according to some aspects of the present disclosure. In some examples, the process 600 may be implemented by a wireless communication device as described above and illustrated in FIGS. 1-3. In some examples, the process 600 may be implemented by any suitable means for carrying out the described functions.

At block 602, the wireless communication device may calculate a respective cumulative sum for each synthetic channel of a set of synthetic channels. For example, each cumulative sum may be calculated from a binary representation of a position of the synthetic channel within the set of synthetic channels. In some examples, the binary representation of the synthetic channel position has a size (e.g., number of components) equal to the size (e.g., number of components) of the cumulative sum. Thus, the cumulative sum may be calculated by adding the value of the mth component of the binary representation of the synthetic channel position to the value of the (m−1)th component in the cumulative sum to produce the value of the mth component in the cumulative sum. For example, the polar encoder 341 shown and described above in connection with FIG. 3 may calculate the cumulative sums.

At block 604, the wireless communication device may sort the set of synthetic channels in order of reliability based on the respective cumulative sums to produce an order of synthetic channels. For example, after sorting, the order of synthetic channels may be from highest reliability to lowest reliability. For example, the polar encoder 341 shown and described above in connection with FIG. 3 may sort the set of synthetic channels.

At block 606, the wireless communication device may identify the K best synthetic channels based on the order, and at block 608, the wireless communication device may place information bits within information bit locations of an information block corresponding to the K best synthetic channels (e.g., "good" synthetic channels). At block 610, the wireless communication device may further place frozen bits within frozen bit location of the information block corresponding to the remaining N−K synthetic channels (e.g., "bad" synthetic channels). For example, the polar encoder 341 shown and described above in connection with FIG. 3 may identify the K best synthetic channels, place information bits in bit locations of an information block corresponding to the K best synthetic channels, and place frozen bits in the remaining bit locations of the information block (e.g., in the bit locations corresponding to the remaining N−K synthetic channels).

At block 612, the wireless communication device may polar code the information block to produce a polar codeword, and at block 614, the wireless communication device may transmit the polar codeword to a receiving wireless communication device. For example, the polar encoder 341 shown and described above in connection with FIG. 3 may polar code the information block to produce the polar codeword. In addition, the transceiver 310 shown and described above in connection with FIG. 3 may transit the polar codeword over a wireless air interface to the receiving wireless communication device.

Figure 7:
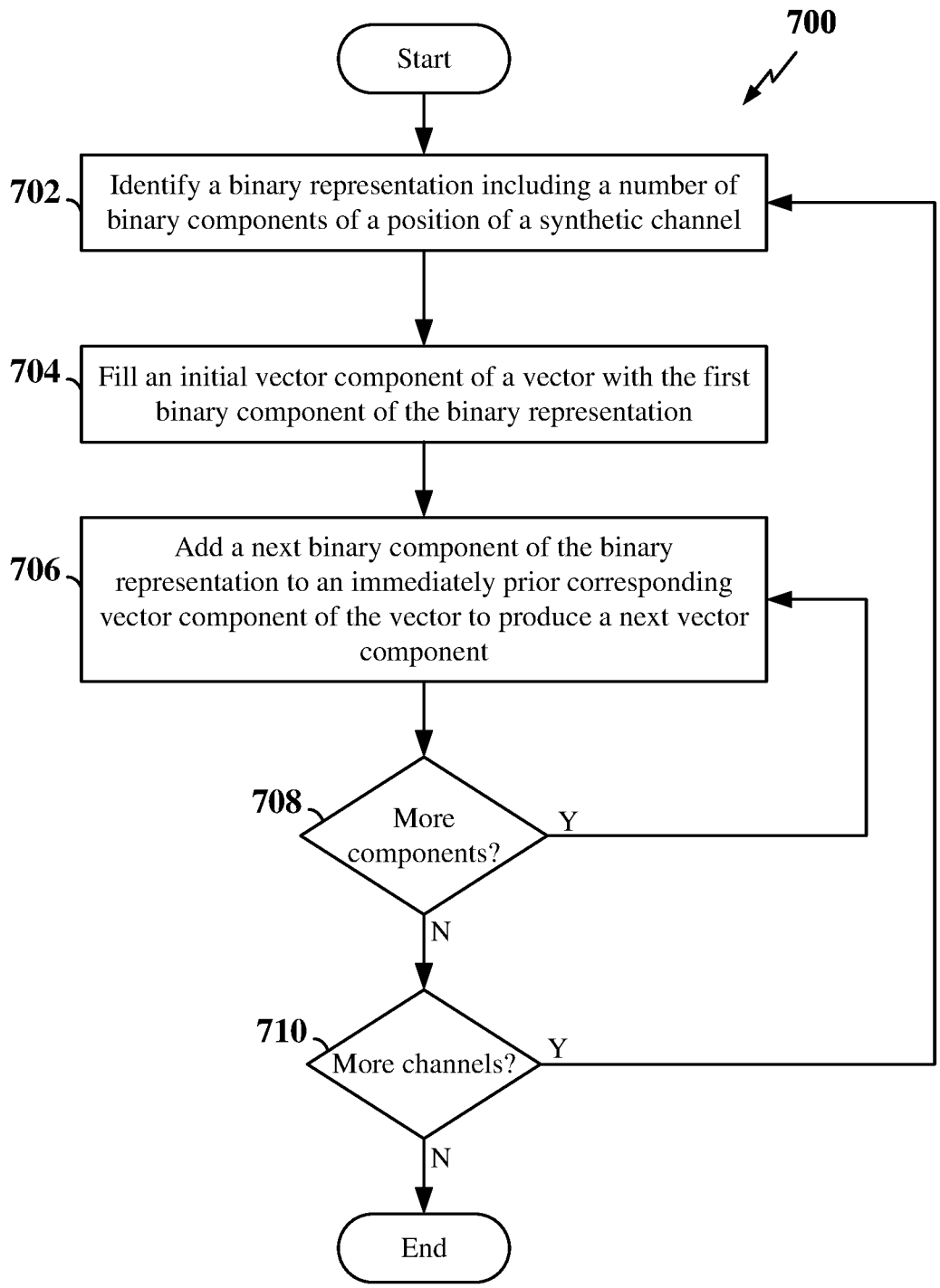
FIG. 7 is a flow chart illustrating an exemplary process for calculating the cumulative sum for each synthetic channel during polar coding according to some aspects of the present disclosure.

FIG. 7 is a flow chart illustrating an exemplary process 700 for calculating the cumulative sum for each synthetic channel during polar coding according to some aspects of the present disclosure. In some examples, the process 700 may be implemented by a wireless communication device as described above and illustrated in FIGS. 1-3. In some examples, the process 700 may be implemented by any suitable means for carrying out the described functions.

At block 702, the wireless communication device may identify a binary representation of a position of a synthetic channel within the set of synthetic channels. In some examples, the binary representation of the synthetic channel position has a size (e.g., number of binary components) equal to the size (e.g., number of vector components) of a vector corresponding to the cumulative sum. For example, the polar encoder 341 shown and described above in connection with FIG. 3 may identify the binary representation of the synthetic channel position.

At block 704, the wireless communication device may fill an initial vector component of a vector corresponding to the cumulative sum with the first binary component of the binary representation. At block 706, the wireless communication device may add a next binary component of the binary representation to an immediately prior corresponding vector component of the vector to produce a next vector component of the cumulative sum. For example, the polar encoder 341 shown and described above in connection with FIG. 3 may calculate the cumulative sum of the binary representation.

At block 708, the wireless communication device may determine whether there are more binary components in the binary representation of the synthetic channel position. If there are more binary components (Y branch of block 708), the process repeats at block 706, where the wireless communication device may add the next binary component of the binary representation to the immediately prior corresponding vector component. If there are no more binary components (N branch of block 708), at block 710, the wireless communication device may determine whether there are more synthetic channels in the set of synthetic channels. If there are additional synthetic channels (Y branch of block 710), the process repeats at block 702.

Figure 8:
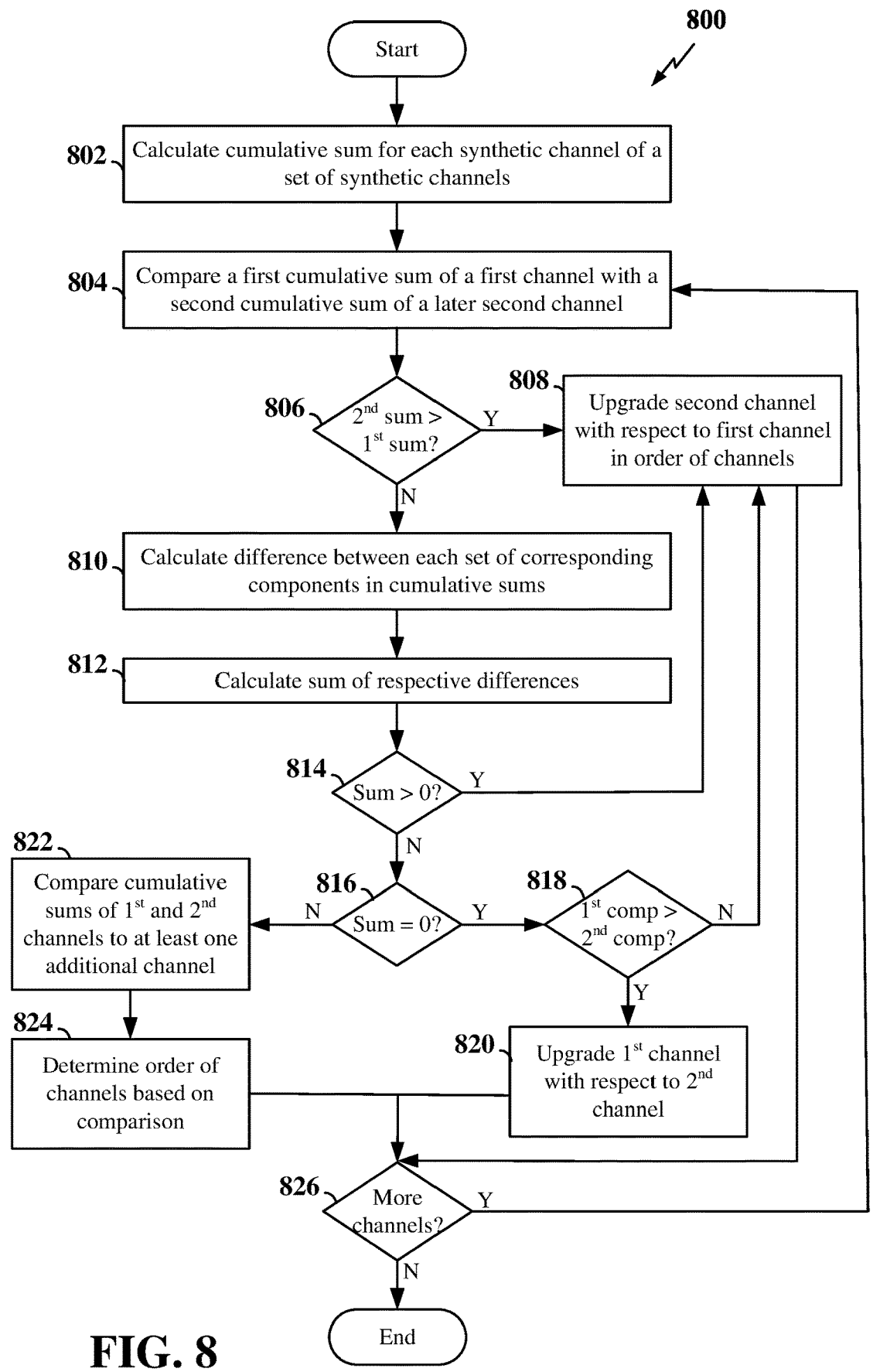
FIG. 8 is a flow chart illustrating an exemplary process for sorting synthetic channels based on the cumulative sums for each synthetic channel during polar coding according to some aspects of the present disclosure.

FIG. 8 is a flow chart illustrating an exemplary process 800 for sorting synthetic channels based on the cumulative sums for each synthetic channel during polar coding according to some aspects of the present disclosure. In some examples, the process 800 may be implemented by a wireless communication device as described above and illustrated in FIGS. 1-3. In some examples, the process 800 may be implemented by any suitable means for carrying out the described functions.

At block 802, the wireless communication device may calculate a respective cumulative sum for each synthetic channel of a set of synthetic channels. For example, each cumulative sum may be calculated from a binary representation of a position of the synthetic channel within the set of synthetic channels. In some examples, the binary representation of the synthetic channel position has a size (e.g., number of components) equal to the size (e.g., number of components) of the cumulative sum. Thus, the cumulative sum may be calculated by adding the value of the mth component of the binary representation of the synthetic channel position to the value of the (m−1)th component in the cumulative sum to produce the value of the mth component in the cumulative sum. For example, the polar encoder 341 shown and described above in connection with FIG. 3 may calculate the cumulative sums.

At block 804, the wireless communication device may compare a first cumulative sum of a first synthetic channel (e.g., at position i within an order of synthetic channels) with a second cumulative sum of a later second synthetic channel (e.g., at position j within the order of synthetic channels). For example, the polar encoder 341 shown and described above in connection with FIG. 3 may compare the cumulative sums of the first and second synthetic channels.

At block 806, the wireless communication device may determine whether the second cumulative sum of the second synthetic channel is component-wise greater than the first cumulative sum of the first synthetic channel (e.g., if each component of the second cumulative sum is greater than the corresponding component of the first cumulative sum). If the second cumulative sum is component-wise greater than the first cumulative sum (Y branch of block 806), at block 808, the wireless communication device may upgrade the second synthetic channel with respect to the first synthetic channel in the order of synthetic channels. For example, the second synthetic channel may be moved to position i and the first synthetic channel may be moved to position j within the order of synthetic channels. For example, the polar encoder 341 shown and described above in connection with FIG. 3 may upgrade the second synthetic channel with respect to the first synthetic channel if the second cumulative sum of the second synthetic channel is greater than the first cumulative sum of the first synthetic channel.

If the second cumulative sum is not component-wise greater than the first cumulative sum (N branch of block 806), at block 810, the wireless communication device may calculate a respective difference between each set of corresponding components in the first and second cumulative sums. At block 812, the wireless communication device may then calculate the sum of the respective differences. For example, the polar encoder 341 shown and described above in connection with FIG. 3 may calculate the respective component-wise differences and then calculate the sum of the differences.

At block 814, the wireless communication device may determine whether the sum of the respective differences between the corresponding cumulative sum components of the second synthetic channel at position j (later position) and the first synthetic channel at position i (earlier position) is greater than zero. If the sum of the respective differences is greater than zero (Y branch of block 814), the wireless communication device may upgrade the second synthetic channel with respect to the first synthetic channel in the order of synthetic channels. For example, the polar encoder 341 shown and described above in connection with FIG. 3 may upgrade the second synthetic channel with respect to the first synthetic channel if the sum of the respective differences is greater than zero.

If the sum of the respective differences between the corresponding cumulative sum components of the second synthetic channel at position j and the first synthetic channel at position i is not greater than zero (N branch of block 814), at block 816, the wireless communication device may determine whether the sum of the respective differences between the corresponding cumulative sum components of the second synthetic channel at position j and the first synthetic channel at position i is equal to zero. If the sum of the respective differences is equal to zero (Y branch of block 816), at block 818, the wireless communication device may individually compare the components of the cumulative sums of the first and second synthetic channels starting with either the last component or the first component to determine whether the cumulative sum component(s) of the first cumulative sum are greater than the corresponding cumulative sum component(s) of the second cumulative sum. If the corresponding cumulative sum components are equal, the next corresponding cumulative sum components may be compared. For example, if the last component of the first cumulative sum is equal to the last component of the second cumulative sum, the wireless communication device may compare the next-to-last components of the first and second cumulative sums.

If the individual component(s) of the first synthetic channel are greater than the individual component(s) of the second synthetic channel (Y branch of block 818), at block 820, the wireless communication device may upgrade the first synthetic channel with respect to the second synthetic channel in the order of synthetic channels (e.g., maintain the first synthetic channel at position i and the second synthetic channel at position j). If the individual component(s) of the first synthetic channel are not greater than the individual component(s) of the second synthetic channel (N branch of block 818), at block 808, the wireless communication device may upgrade the second synthetic channel with respect to the first synthetic channel in the order of synthetic channels (e.g., move the second synthetic channel from position j to position i and move the first synthetic channel at position i to position j). For example, the polar encoder 341 shown and described above in connection with FIG. 3 may upgrade the first or second synthetic channel based on the individual cumulative sum component comparison(s).

If the sum of the respective differences between the corresponding cumulative sum components of the second synthetic channel at position j and the first synthetic channel at position i is not equal to zero (N branch of block 816), at block 822, the wireless communication device may compare the cumulative sums of the first and second synthetic channels to the cumulative sum of at least one at least one additional channel, and at block 824, determine the order of the first and second synthetic channels based on the comparison. For example, the polar encoder 341 shown and described above in connection with FIG. 3 may compare the cumulative sums of the first and second synthetic channels to the cumulative sum of one or more other synthetic channels to determine the sequence (order) of the first and second synthetic channels.

At block 826, the wireless communication device may determine whether there are more synthetic channels in the set of synthetic channels. If there are more synthetic channels (Y branch of block 826), the process repeats at block 804 where the wireless communication device compares the cumulative sums of two synthetic channels that have not previously been compared.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-8 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of polar coding at a transmitting wireless communication device, comprising:
    computing respective first mutual information for each synthetic channel of a set of synthetic channels based on an underlying Additive White Gaussian Noise (AWGN) channel;
    computing respective second mutual information for each synthetic channel of the set of synthetic channels based on an underlying binary erasure channel;
    computing a respective metric for each synthetic channel of the set of synthetic channels based on a convex combination of the respective first mutual information and the respective second mutual information;
    sorting the set of synthetic channels in order of reliability based on the respective metrics to produce an order of synthetic channels;
    identifying K best synthetic channels of the set of synthetic channels in accordance with the order of synthetic channels;
    placing information bits within information bit locations of an information block corresponding to the K best synthetic channels;
    placing frozen bits within frozen bit locations of the information block corresponding to N–K synthetic channels;
    polar coding the information block to produce a polar codeword; and
    transmitting the polar codeword to a receiving wireless communication device over a wireless air interface.

2. The method of claim 1, wherein computing the respective metric for each synthetic channel further comprises:
    calculating the convex combination of the respective first mutual information and the respective second mutual information utilizing respective weights of the first mutual information and the second mutual information.

3. The method of claim 2, wherein calculating the convex combination of the respective first mutual information and the respective second mutual information further comprises:
multiplying the respective first mutual information by a first weight to produce a respective weighted first mutual information;
subtracting the first weight from one to produce a second weight;
multiplying the respective second mutual information by the second weight to produce a respective weighted second mutual information; and
adding the respective weighted first mutual information to the respective weighted second mutual information to produce the respective metric for the respective synthetic channel of the set of synthetic channels.

4. The method of claim 3, wherein the first weight is 0.3.

5. The method of claim 1, wherein the polar codeword comprises a plurality of coded bit locations, each corresponding to one of the synthetic channels of the set of synthetic channels, and further comprising:
identifying the information bit locations within the information block that contribute to the coded bit locations corresponding to the K best synthetic channels.

6. The method of claim 1, wherein the underlying AWGN channel comprises a signal-to-noise ratio (SNR) tuned to a channel capacity, wherein the channel capacity is equal to a code rate of the polar codeword.

7. The method of claim 6, wherein the underlying binary erasure channel comprises an erasure probability equal to a difference between one and the code rate.

8. An apparatus configured for polar coding, the apparatus comprising:
a transceiver;
a memory; and
a processor communicatively coupled to the transceiver and the memory, the processor configured to:
compute respective first mutual information for each synthetic channel of a set of synthetic channels based on an underlying Additive White Gaussian Noise (AWGN) channel;
compute respective second mutual information for each synthetic channel of the set of synthetic channels based on an underlying binary erasure channel;
compute a respective metric for each synthetic channel of the set of synthetic channels based on a convex combination of the respective first mutual information and the respective second mutual information;
sort the set of synthetic channels in order of reliability based on the respective metrics to produce an order of synthetic channels;
identify K best synthetic channels of the set of synthetic channels in accordance with the order of synthetic channels;
place information bits within information bit locations of an information block corresponding to the K best synthetic channels;
place frozen bits within frozen bit locations of the information block corresponding to N–K synthetic channels;
polar code the information block to produce a polar codeword; and
transmit the polar codeword to a receiving wireless communication device over a wireless air interface via the transceiver.

9. The apparatus of claim 8, wherein the processor is further configured to:
calculate the convex combination of the respective first mutual information and the respective second information utilizing respective weights of the first mutual information and the second mutual information.

10. The apparatus of claim 9, wherein the processor is further configured to:
multiply the respective first mutual information by a first weight to produce a respective weighted first mutual information;
subtract the first weight from one to produce a second weight;
multiply the respective second mutual information by the second weight to produce a respective weighted second mutual information; and
add the respective weighted first mutual information to the respective weighted second mutual information to produce the respective metric for the respective synthetic channel of the set of synthetic channels.

11. The apparatus of claim 8, wherein the polar codeword comprises a plurality of coded bit locations, each corresponding to one of the synthetic channels of the set of synthetic channels, and wherein the processor is further configured to:
identify the information bit locations within the information block that contribute to the coded bit locations corresponding to the K best synthetic channels.

12. The apparatus of claim 8, wherein:
the underlying AWGN channel comprises a signal-to-noise ratio (SNR) tuned to a channel capacity, wherein the channel capacity is equal to a code rate of the polar codeword; and
the underlying binary erasure channel comprises an erasure probability equal to a difference between one and the code rate.

13. The apparatus of claim 10, wherein the first weight is 0.3.

14. A transmitting wireless communication device, comprising:
means for computing respective first mutual information for each synthetic channel of a set of synthetic channels based on an underlying Additive White Gaussian Noise (AWGN) channel;
means for computing respective second mutual information for each synthetic channel of the set of synthetic channels based on an underlying binary erasure channel;
means for computing a respective metric for each synthetic channel of the set of synthetic channels based on a convex combination of the respective first mutual information and the respective second mutual information;
means for sorting the set of synthetic channels in order of reliability based on the respective metrics to produce an order of synthetic channels;
means for identifying K best synthetic channels of the set of synthetic channels in accordance with the order of synthetic channels;
means for placing information bits within information bit locations of an information block corresponding to the K best synthetic channels;
means for placing frozen bits within frozen bit locations of the information block corresponding to N–K synthetic channels;
means for polar coding the information block to produce a polar codeword; and means for transmitting the polar codeword to a receiving wireless communication device over a wireless air interface.

15. The transmitting wireless communication device of claim 14, wherein the means for computing the respective metric for each synthetic channel further comprises:
   means for calculating the convex combination of the respective first mutual information and the respective second information utilizing respective weights of the first mutual information and the second mutual information.

16. The transmitting wireless communication device of claim 15, wherein the means for calculating the convex combination of the respective first mutual information and the respective second mutual information further comprises:
   means for multiplying the respective first mutual information by a first weight to produce a respective weighted first mutual information;
   means for subtracting the first weight from one to produce a second weight;
   means for multiplying the respective second mutual information by the second weight to produce a respective weighted second mutual information; and
   means for adding the respective weighted first mutual information to the respective weighted second mutual information to produce the respective metric for the respective synthetic channel of the set of synthetic channels.

17. The transmitting wireless communication device of claim 16, wherein the first weight is 0.3.

18. The transmitting wireless communication device of claim 14, wherein the polar codeword comprises a plurality of coded bit locations, each corresponding to one of the synthetic channels of the set of synthetic channels, and further comprising:
   means for identifying the information bit locations within the information block that contribute to the coded bit locations corresponding to the K best synthetic channels.

19. The transmitting wireless communication device of claim 14, wherein the underlying AWGN channel comprises a signal-to-noise ratio (SNR) tuned to a channel capacity, wherein the channel capacity is equal to a code rate of the polar codeword.

20. The transmitting wireless communication device of claim 18, wherein the underlying binary erasure channel comprises an erasure probability equal to a difference between one and the code rate.

21. A non-transitory computer-readable medium storing computer-executable code, comprising code for causing a transmitting wireless communication device to:
   compute respective first mutual information for each synthetic channel of a set of synthetic channels based on an underlying Additive White Gaussian Noise (AWGN) channel;
   compute respective second mutual information for each synthetic channel of the set of synthetic channels based on an underlying binary erasure channel;
   compute a respective metric for each synthetic channel of the set of synthetic channels based on a convex combination of the respective first mutual information and the respective second mutual information;
   sort the set of synthetic channels in order of reliability based on the respective metrics to produce an order of synthetic channels;
   identify K best synthetic channels of the set of synthetic channels in accordance with the order of synthetic channels;
   place information bits within information bit locations of an information block corresponding to the K best synthetic channels;
   place frozen bits within frozen bit locations of the information block corresponding to N–K synthetic channels;
   polar code the information block to produce a polar codeword; and
   transmit the polar codeword to a receiving wireless communication device over a wireless air interface via the transceiver.

22. The non-transitory computer-readable medium of claim 20, further comprising code for causing the transmitting wireless communication device to:
   calculate the convex combination of the respective first mutual information and the respective second information utilizing respective weights of the first mutual information and the second mutual information.

23. The non-transitory computer-readable medium of claim 21, further comprising code for causing the transmitting wireless communication device to:
   multiply the respective first mutual information by a first weight to produce a respective weighted first mutual information;
   subtract the first weight from one to produce a second weight;
   multiply the respective second mutual information by the second weight to produce a respective weighted second mutual information; and
   add the respective weighted first mutual information to the respective weighted second mutual information to produce the respective metric for the respective synthetic channel of the set of synthetic channels.

24. The non-transitory computer-readable medium of claim 22, wherein the first weight is 0.3.

25. The non-transitory computer-readable medium of claim 20, wherein the polar codeword comprises a plurality of coded bit locations, each corresponding to one of the synthetic channels of the set of synthetic channels, and further comprising code for causing the transmitting wireless communication device to:
   identify the information bit locations within the information block that contribute to the coded bit locations corresponding to the K best synthetic channels.

26. The non-transitory computer-readable medium of claim 20, wherein the underlying AWGN channel comprises a signal-to-noise ratio (SNR) tuned to a channel capacity, wherein the channel capacity is equal to a code rate of the polar codeword.

27. The non-transitory computer-readable medium of claim 25, wherein the underlying binary erasure channel comprises an erasure probability equal to a difference between one and the code rate.

* * * * *